United States Patent
Lee et al.

(10) Patent No.: US 7,190,588 B2
(45) Date of Patent: Mar. 13, 2007

(54) HEAT-DISSIPATING FIN ASSEMBLY FOR HEAT SINK

(75) Inventors: Hsieh-Kun Lee, Tu-Cheng (TW); Wan-Lin Xia, Shen-Zhen (CN); Bao-Chun Chen, Shen-Zhen (CN); Neng-Bin Li, Shen-Zhen (CN)

(73) Assignees: Fu Zhun Precision Industry (Shen Zhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 124 days.

(21) Appl. No.: 11/135,171

(22) Filed: May 23, 2005

(65) Prior Publication Data

US 2006/0012961 A1    Jan. 19, 2006

(30) Foreign Application Priority Data

Jul. 13, 2004   (CN)   ................. 2004 2 0071681

(51) Int. Cl.
*H05K 7/20*   (2006.01)

(52) U.S. Cl. ............ 361/704; 361/709; 361/710; 361/703; 165/78; 165/80.3; 165/185

(58) Field of Classification Search ........ 361/702–704, 361/709, 710, 703; 257/706, 719, 721, 722; 165/78, 79, 182, 122, 80.3, 185, 104.33; 29/890.03

See application file for complete search history.

(56) References Cited

U.S. PATENT DOCUMENTS

| 6,449,160 | B1 | 9/2002 | Tsai |
| 6,474,407 | B1 | 11/2002 | Chang et al. |
| 6,595,275 | B1 * | 7/2003 | Wang et al. ............... 165/185 |
| 6,644,386 | B1 * | 11/2003 | Hsu ........................ 165/80.3 |
| 6,651,733 | B1 | 11/2003 | Horng et al. |
| 6,655,448 | B1 * | 12/2003 | Lin ........................ 165/80.3 |
| 6,754,079 | B1 * | 6/2004 | Chang ...................... 361/709 |
| 6,772,828 | B1 * | 8/2004 | Chen ........................ 165/78 |

FOREIGN PATENT DOCUMENTS

| TW | 5 26949 | * | 4/2003 |
| TW | 570497 |  | 1/2004 |

* cited by examiner

*Primary Examiner*—Michael Datskovskiy
(74) *Attorney, Agent, or Firm*—Morris Manning & Martin LLP; Tim Tingkang Xia, Esq.

(57) ABSTRACT

A heat-dissipating fin assembly (1) includes a plurality of individual fin plates (12) arranged side by side. Each fin plate includes a main body (14). First and second flanges (16, 18) extend perpendicularly from opposite edges of the main body of each fin plate. A pair of spaced first bridge-shaped tabs (20) extends perpendicularly from the first flange toward the second flange. A pair of spaced second bridge-shaped tabs (24) extends perpendicularly from the second flange toward the first flange. Projections (28) are stamped from the main body opposing to the first and second bridge-shaped tabs. The tabs of each fin plate are interlocked with the projections of an adjacent fin plate. In this manner, all the fin plates are assembled together. The heat-dissipating fin assembly is thus formed.

16 Claims, 5 Drawing Sheets

HEAT-DISSIPATING FIN ASSEMBLY FOR HEAT SINK

BACKGROUND

1. Field

The present invention relates to a heat sink for removing heat from heat-generating electronic devices, and more particularly to a heat-dissipating fin assembly of a heat sink with high density fins that are interlocked together.

2. Related Art

An integrated circuit chip is widely used in an electrical apparatus such as computer. When the electrical apparatus operates, the chip generates heat. If the chip is unable to transfer enough heat to ambient air, the elevated operating temperature may result in damage of the chip or the breakdown of the whole apparatus. In order to remove most heat generated from the chip, a heat sink is usually provided and attached on the top surface of the chip. Generally, the heat sink is provided with a flat base for contacting with the chip and fins for dissipating the heat of the chip into air. The fins can be classified into two types: one is integrally formed with the base by extrusion, and the other is stamped individually and connected together and then secured to the base by gluing or soldering. In comparison with the former, the latter can have the advantages of a high fin density and light weight.

FIG. 5 shows a heat-dissipating fin assembly 100 having a plurality of uniformly dimensioned individual plate fins 102 stacked together. The fins 102 are formed by stamping and each have top and bottom flanges 104. Each flange 104 defines a pair of slots 106 at a junction with a main body of the fin 102. Each flange 104 forms a pair of tabs 108 extending from an outer edge thereof and located near the slots 106 respectively. The tabs 108 of each fin 102 engage in the slots 106 of an adjacent fin 102. Protrusions 109 formed on the tabs 108 of each fin 102 are blocked by the main body of the adjacent fin 102 such that said tabs 108 are retained in the slots 106 of the adjacent fin 102. Thus, all the fins 102 are connected together to form the fin assembly 100. However, the fins 102 are hold together only by the protrusions 109 blocked by the main bodies of the fins 102. The protrusions 109 are prone to be disengaged from the corresponding adjacent fins 102 when the fin assembly 100 is subjected to shock or vibration during transportation or in operation. Part of or even the entire fin assembly 100 may collapse.

SUMMARY

Accordingly, what is needed is a heat sink having a heat-dissipating fin assembly which removes heat to atmosphere rapidly and is stable and sturdy before the assembly is secured to a base of the heat sink.

A heat-dissipating fin assembly in accordance with a preferred embodiment of the present invention comprises a plurality of individual fin plates arranged side by side. Each fin plate includes a main body. First and second flanges extend perpendicularly from opposite edges of the main body of each fin plate. A pair of spaced first bridge-shaped tabs extends perpendicularly from the first flange toward the second flange. A pair of spaced second bridge-shaped tabs extends perpendicularly from the second flange toward the first flange. Projections are stamped from the main body opposing to the first and second bridge-shaped tabs. The tabs of each fin plate are interlocked with the projections of an adjacent fin plate. In this manner, all the fin plates are assembled together. The heat-dissipating fin assembly is thus formed. The heat-dissipating fin assembly can be secured to a flat metal base by soldering the second flanges thereto, thereby forming a heat sink.

Other advantages and novel features of the present invention will become more apparent from the following detailed description when taken in conjunction with the accompanying drawings, in which:

BRIEF DESCRIPTION OF THE DRAWINGS

Reference will now be made to the drawing figures to describe the present invention in detail.

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
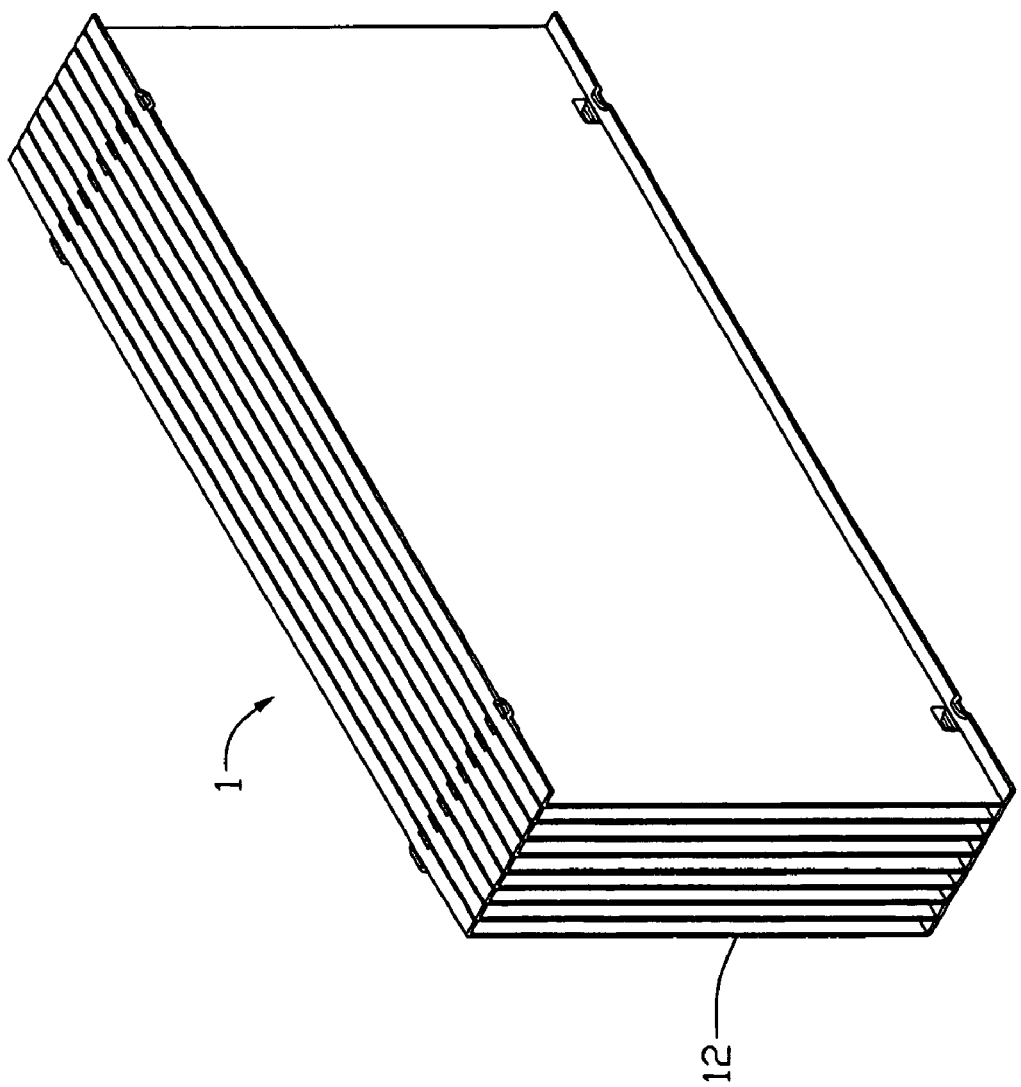
FIG. 1 is an isometric view of a heat-dissipating fin assembly in accordance with the preferred embodiment of the present invention, the assembly comprising a plurality of fin plates.
Figure 2:
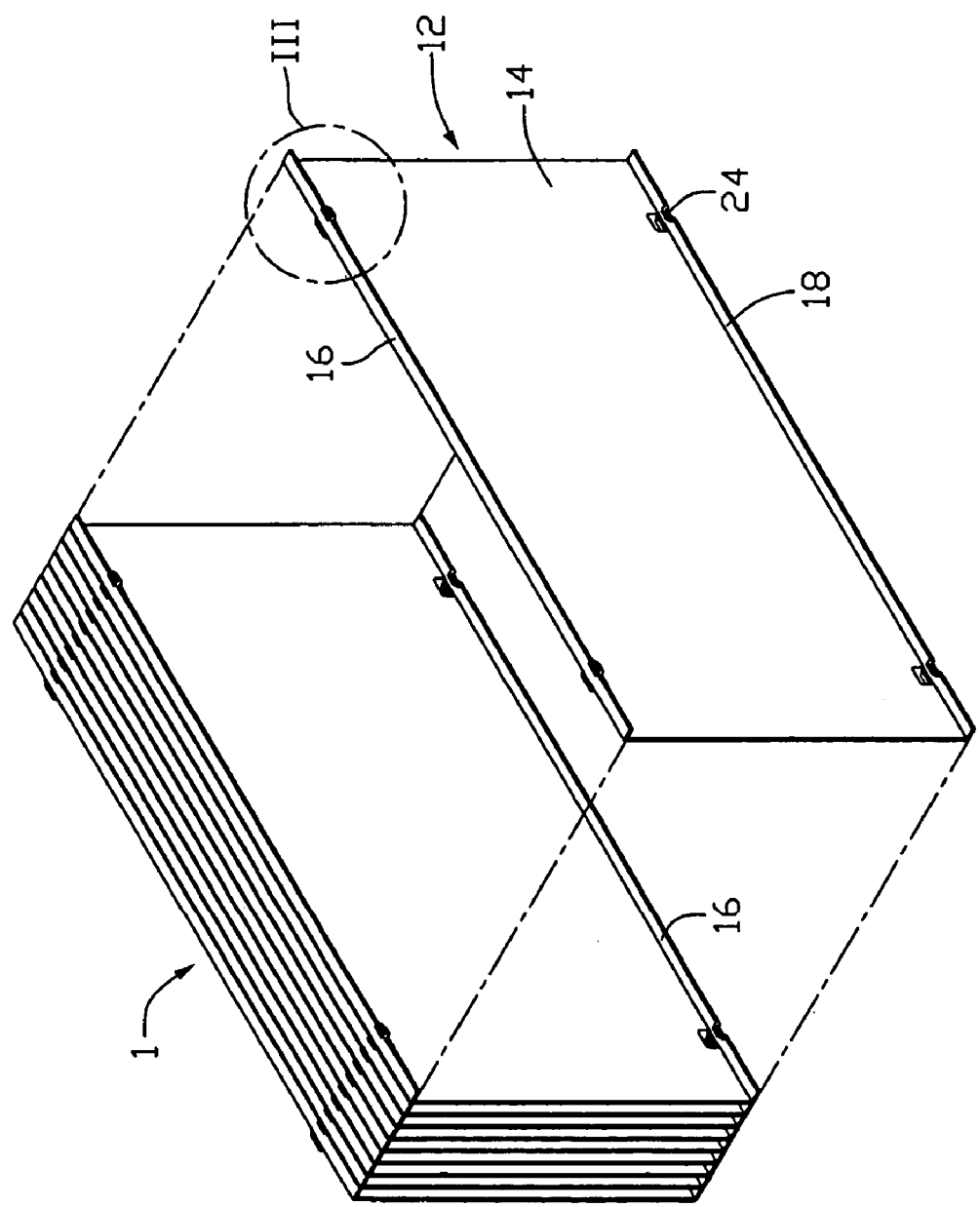
FIG. 2 is a view similar to FIG. 1 with one fin plate is separately shown from the others to more clearly show the structure of the fin plate.
Figure 3:
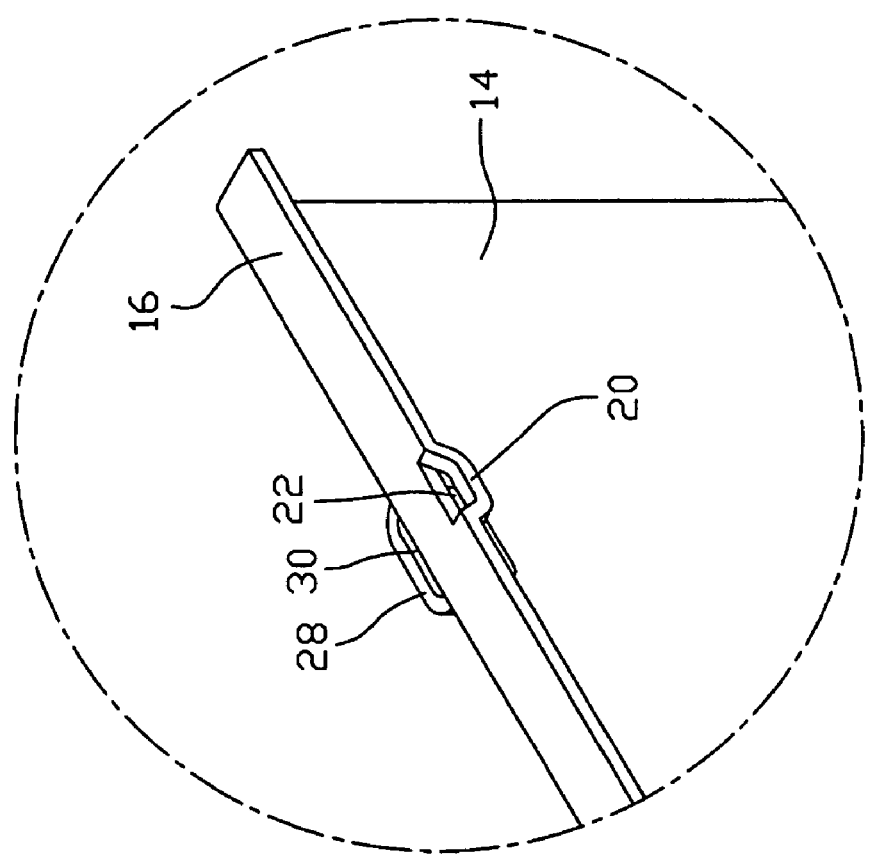
FIG. 3 is an enlarged view of part III of FIG. 2.
Figure 4:
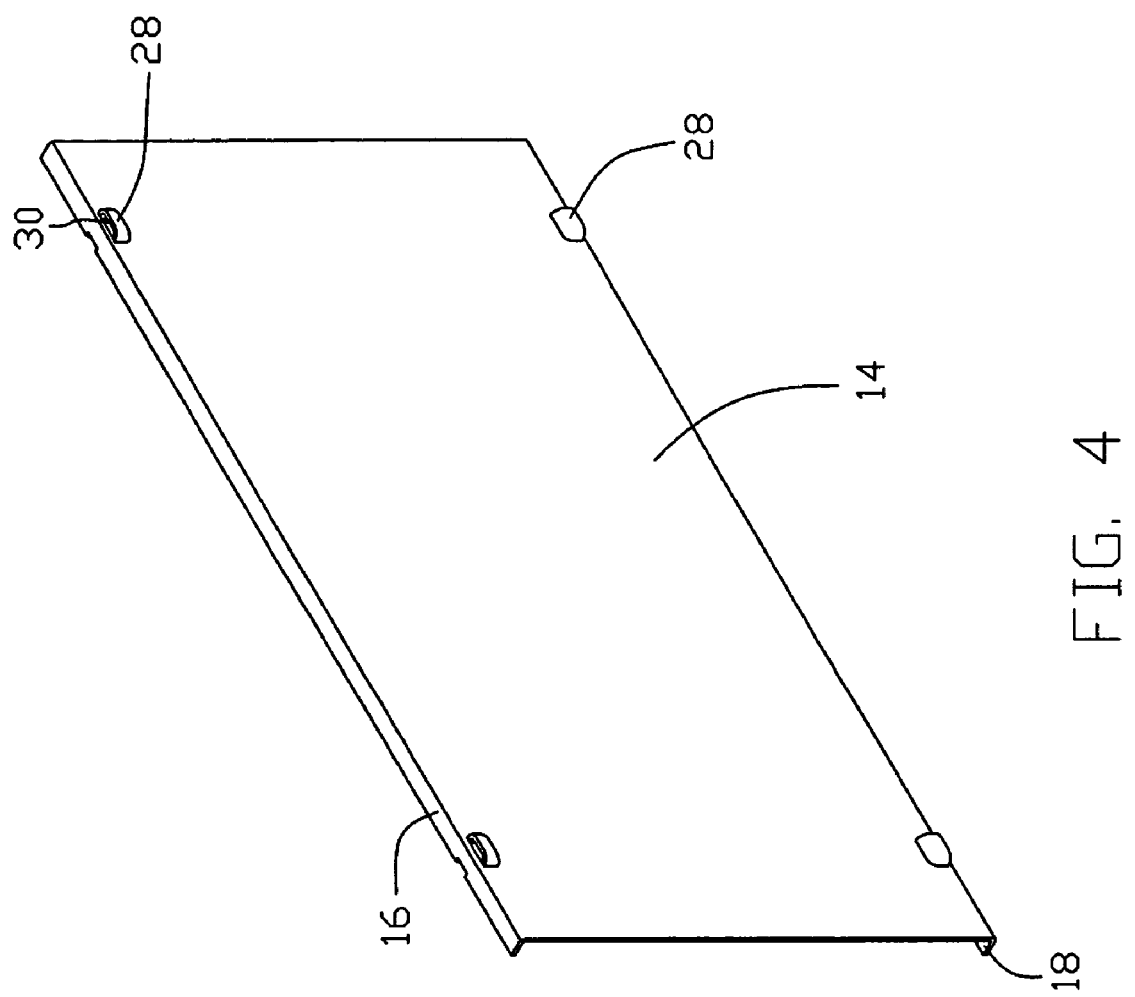
FIG. 4 is an isometric view of a fin plate of the heat sink of FIG. 1, but viewed from another aspect.
Figure 5:
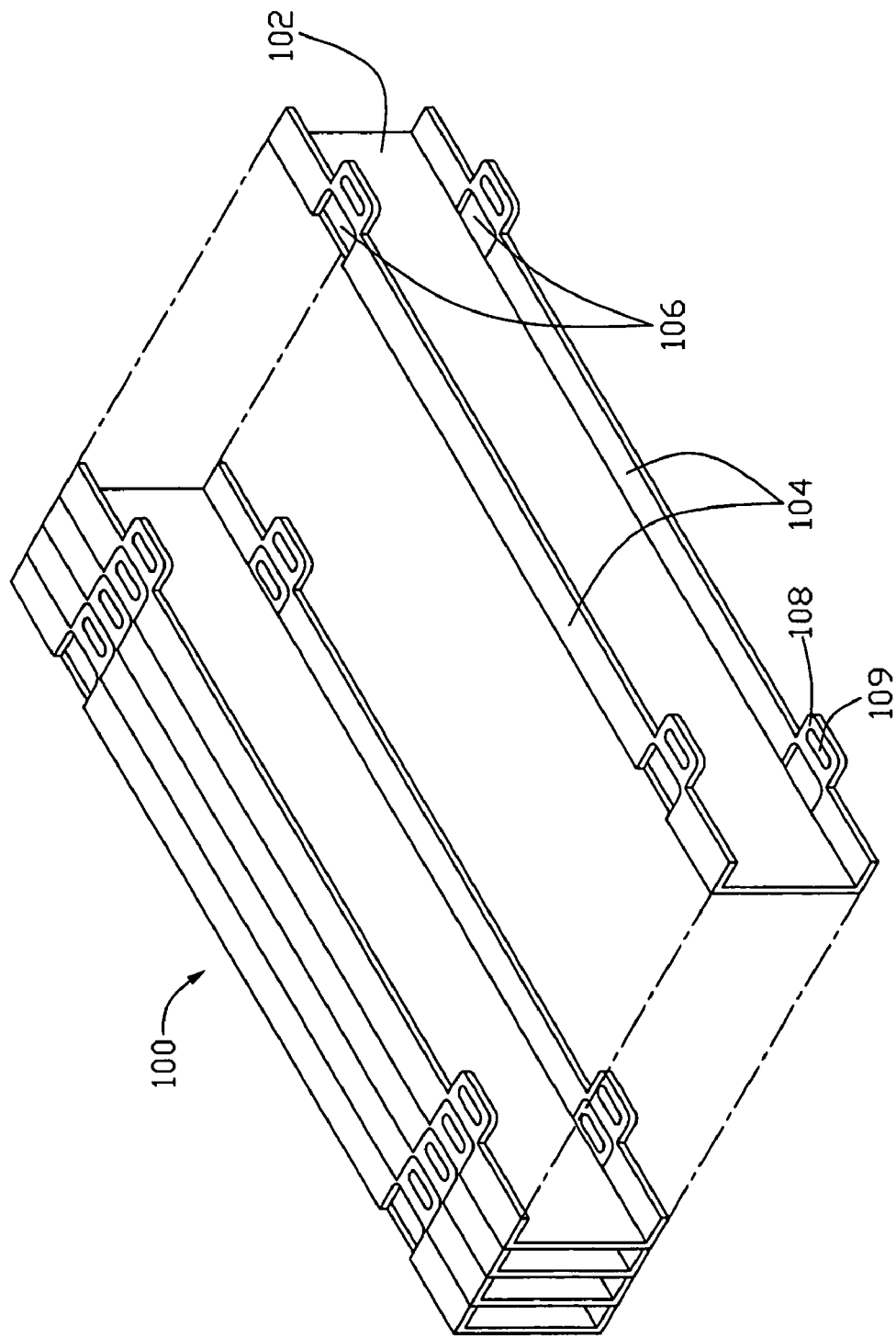
FIG. 5 is an isometric view of a conventional heat-dissipating fin assembly.

Referring to FIGS. 1–4, a heat-dissipating fin assembly 1 of a heat dissipating assembly in accordance with a preferred embodiment of the present invention comprises a plurality of individual fin plates 12 arranged side by side.

Each fin plate 12 is made of a highly thermal conductive material such as aluminum or copper, and is formed by stamping to have a main body 14. First and second flanges 16, 18 extend perpendicularly in a first direction from opposite top and bottom edges of the main body 14 respectively. A pair of spaced first bridge-shaped tabs 20 extends perpendicularly from a distal end of the first flange 16 toward the second flange 18, and a pair of first slots 22 is defined in the first flange 16 above the tabs 20, respectively. A pair of spaced second bridge-shaped tabs 24 extends perpendicularly from a distal end of the second flange 18 toward the first flange 16, and a pair of second slots (not labeled) is defined in the second flange 18 below the tabs 24, respectively. The first and the second bridge-shaped tabs 20, 24 are parallel to the main body 14 of the fin plate 12. Four spaced projections 28 with a shape of a half barrel open to be accessible from both sides of the main body 14 from only one opening are stamped from the main body 14 in a second direction opposing the first direction. The projections 28 are located corresponding to the first and second bridge-shaped tabs 20, 24 of an adjacent fin plate 12 when assembling the adjacent fin plate to the fin plate. A recess 30 is defined in each projection 28. The recesses 30 are designated hereinafter as upper recesses 30 and lower recesses 30 according to their respective locations.

In assembly of the fin plates 12 to form the heat-dissipating fin assembly 1, the first bridge-shaped tabs 20 of each fin plate 12 are engagingly received in the upper recesses 30 of an adjacent fin plate 12. The second bridge-shaped tabs 24 of each fin plate 12 are engagingly received in the lower recesses 30 of the adjacent fin plate 12. In this manner, all the fin plates 12 are assembled together, and the heat-dissipating fin assembly 1 is thus formed. The first flanges 16 are coplanar with each other, and the second flanges 18 are coplanar with each other. The fin assembly 1 can be mounted on a surface of a flat metal plate, which is used to attach to a heat source, with either the first or the second flanges 16, 18 being soldered or glued thereto.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat-dissipating fin assembly comprising:
   a plurality of individual fin plates arranged side by side, each of the fin plates comprising:
   a main body;
   a first flange extending perpendicularly from the main body, a first bridge-shaped tab extending perpendicularly from the first flange;
   a second flange extending perpendicularly from the main body, the second flange being parallel to and spaced from the first flange, a second bridge-shaped tab extending perpendicularly from the second flange face to face with the first bridge-shaped tab; and
   projections opposing to the first and the second tabs extending from the main body;
   wherein the first and the second tabs of each fin plate are interlocked with the projections of an adjacent fin plate.

2. The assembly as claimed in claim 1, wherein the first flange extends from an edge of the main body, and the second flange extends from an opposite edge of the main body.

3. The assembly as claimed in claim 1, wherein the first bridge-shaped tab and the second bridge-shaped tab are parallel to the main body.

4. The assembly as claimed in claim 1, wherein a recess is defined in each of the projections.

5. The assembly as claimed in claim 4, wherein the first and the second bridge-shaped tabs of the each fin plate are engagingly received in the recesses of the adjacent fin plate.

6. The assembly as claimed in claim 1, wherein the first flanges of the fin plates are coplanar.

7. The assembly as claimed in claim 1, wherein the second flanges of the fin plates are coplanar.

8. A heat-dissipating fin assembly comprising:
   a plurality of fin plates each comprising:
   a main plate;
   an upper flange extending in a first direction from a top side of the main plate, the upper flange forms a downwardly extending tab;
   a lower flange extending in the first direction from a bottom side of the main plate, the lower flange forming an upwardly extending tab;
   an upper projection protruding from the main body in a second direction opposite to the first direction, the upper projection defining a recess therein; and
   a lower projection protruding from the main body in the second direction, the lower projection defining a recess therein;
   wherein the downwardly extending tab of a fin plate engages in the recess of the upper projection of an adjacent fin plate and the upwardly extending tab of the fin plate engages in the recess of the lower projection thereby to secure the two adjacent fin plates together.

9. The assembly of claim 8, wherein the tabs are formed at distal edges of the upper and lower flanges, respectively.

10. The assembly of claim 9, wherein the tabs each have a bridge-like configuration.

11. The assembly of claim 10, wherein the tabs are parallel to the main plate.

12. The assembly of claim 11, wherein the lower flanges are coplanar.

13. The assembly of claim 12, wherein the upper flanges are coplanar.

14. A heat dissipating assembly comprising:
   a plate used to thermally contact with a heat source and gain heat therefrom; and
   a plurality of fin plates disposed next to said plate and capable of gaining said heat from said plate so as to dissipate said heat out of said heat dissipating assembly, each fin plate of said plurality of fin plates comprising a main plate having at least two recessed projections, and two flanges, extending from said main plate, having an recessed tab respectively extending toward each other, said recessed tab of said each fin plate engagable with one of said at least two recessed projections of an adjacent fin plate to said each fin plate so as to fix said each fin plate to said adjacent fin plate.

15. The assembly of claim 14, wherein one of said two flanges extends perpendicularly from an upper side of said main plate, and the other of said two flanges extends perpendicularly from an lower side of said main plate.

16. The assembly of claim 14, wherein said recessed tab is bridge-shaped and each of said at least two projections is half-barrel-shaped.

* * * * *